United States Patent
Lin et al.

(10) Patent No.: US 10,593,594 B2
(45) Date of Patent: Mar. 17, 2020

(54) SELECTIVELY ETCHED SELF-ALIGNED VIA PROCESSES

(71) Applicant: Micromaterials LLC, Wilmington, DE (US)

(72) Inventors: Yung-Chen Lin, Gardena, CA (US); Qingjun Zhou, San Jose, CA (US); Ying Zhang, Santa Clara, CA (US); Ho-yung David Hwang, Cupertino, CA (US); Uday Mitra, Cupertino, CA (US); Regina Freed, Los Altos, CA (US)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 16/216,247

(22) Filed: Dec. 11, 2018

(65) Prior Publication Data

US 2019/0189510 A1  Jun. 20, 2019

Related U.S. Application Data

(60) Provisional application No. 62/599,664, filed on Dec. 15, 2017.

(51) Int. Cl.
*H01L 21/768* (2006.01)
*H01L 21/311* (2006.01)

(52) U.S. Cl.
CPC .. *H01L 21/76897* (2013.01); *H01L 21/76808* (2013.01); *H01L 21/76831* (2013.01);
(Continued)

(58) Field of Classification Search
CPC ..... H01L 2221/1031; H01L 2221/1036; H01L 21/31144; H01L 21/76808;
(Continued)

(56) References Cited

U.S. PATENT DOCUMENTS 4,671,970 A  6/1987 Keiser et al.
5,824,597 A  10/1998 Hong
(Continued)

FOREIGN PATENT DOCUMENTS

JP  2008108757 A  5/2008
JP  2011060803 A  3/2011
(Continued)

OTHER PUBLICATIONS

PCT International Search Report and Written Opinion in PCT/US2017/037141 dated Aug. 31, 2017, 11 pages.
(Continued)

*Primary Examiner* — Hoai V Pham
(74) *Attorney, Agent, or Firm* — Servilla Whitney LLC

(57) ABSTRACT

Methods of forming a self-aligned via comprising recessing a first metallization layer comprising a set of first conductive lines that extend along a first direction on a first insulating layer on a substrate. A second insulating layer is formed on the first insulating layer. A via is formed through the second insulating layer to one of the first conductive lines. Semiconductor devices comprising the self-aligned via and apparatus for forming the self-aligned via are also disclosed.

20 Claims, 13 Drawing Sheets

(52) U.S. Cl.
CPC .. *H01L 21/76883* (2013.01); *H01L 21/31144* (2013.01); *H01L 21/76834* (2013.01); *H01L 2221/1031* (2013.01); *H01L 2221/1036* (2013.01)

(58) Field of Classification Search
CPC ......... H01L 21/76831; H01L 21/76834; H01L 21/76897
See application file for complete search history.

(56) References Cited

U.S. PATENT DOCUMENTS

| | | | |
|---|---|---|---|
| 6,130,151 A | 10/2000 | Lin et al. | |
| 6,143,653 A | 11/2000 | Tsai et al. | |
| 6,528,884 B1 | 3/2003 | Lopatin et al. | |
| 6,576,113 B1 | 6/2003 | Scherer et al. | |
| 6,653,200 B2 | 11/2003 | Olsen | |
| 7,192,803 B1 | 3/2007 | Lin et al. | |
| 7,279,119 B2 | 10/2007 | Hellring et al. | |
| 7,288,463 B1 | 10/2007 | Papasouliotis | |
| 7,541,297 B2 | 6/2009 | Mallick et al. | |
| 7,985,977 B2 | 7/2011 | Gogoi et al. | |
| 8,034,705 B2 | 10/2011 | Choi et al. | |
| 8,338,225 B2 | 12/2012 | Breitwisch et al. | |
| 8,575,753 B2 | 11/2013 | Choi et al. | |
| 8,951,429 B1 | 2/2015 | Liu et al. | |
| 9,012,322 B2 | 4/2015 | Duong et al. | |
| 9,117,884 B1 | 8/2015 | Shaviv et al. | |
| 9,236,292 B2 | 1/2016 | Romero et al. | |
| 9,312,220 B2 | 4/2016 | Lu et al. | |
| 9,324,650 B2 | 4/2016 | Edelstein et al. | |
| 9,362,165 B1 | 6/2016 | Bouche et al. | |
| 9,362,413 B2 | 6/2016 | Yu et al. | |
| 9,368,395 B1 | 6/2016 | Wei et al. | |
| 9,490,202 B2 | 11/2016 | Lin et al. | |
| 9,666,451 B2 | 5/2017 | Wallace et al. | |
| 9,679,781 B2 | 6/2017 | Abatchez et al. | |
| 9,685,406 B1 | 6/2017 | Briggs et al. | |
| 9,721,888 B2 | 8/2017 | Chang et al. | |
| 9,837,314 B2 | 12/2017 | Smith et al. | |
| 10,083,834 B2 | 9/2018 | Thompson et al. | |
| 10,319,604 B2 | 6/2019 | Duan et al. | |
| 10,319,636 B2 | 6/2019 | Basu et al. | |
| 2002/0090812 A1 | 7/2002 | Chang | |
| 2002/0098642 A1 | 7/2002 | Harris et al. | |
| 2002/0163081 A1 | 11/2002 | Aoyama | |
| 2003/0143862 A1 | 7/2003 | Iyer | |
| 2004/0067649 A1 | 4/2004 | Hellring et al. | |
| 2004/0192034 A1 | 9/2004 | Ohiwa et al. | |
| 2005/0121768 A1 | 6/2005 | Edelstein et al. | |
| 2005/0167846 A1 | 8/2005 | Aoyama | |
| 2005/0266627 A1 | 12/2005 | Furukawa et al. | |
| 2006/0169576 A1 | 8/2006 | Brown et al. | |
| 2006/0286806 A1 | 12/2006 | Ohkuni et al. | |
| 2007/0166981 A1 | 7/2007 | Furukawa et al. | |
| 2007/0199922 A1 | 8/2007 | Shen et al. | |
| 2008/0160783 A1 | 7/2008 | Watanabe et al. | |
| 2008/0182411 A1 | 7/2008 | Elers | |
| 2008/0242097 A1 | 10/2008 | Boescke et al. | |
| 2009/0017631 A1 | 1/2009 | Bencher | |
| 2009/0072409 A1 | 3/2009 | Nitta et al. | |
| 2009/0174040 A1 | 7/2009 | Gogoi et al. | |
| 2009/0269569 A1 | 10/2009 | Fucsko et al. | |
| 2010/0078617 A1 | 4/2010 | Breitwisch et al. | |
| 2010/0096691 A1 | 4/2010 | Shin et al. | |
| 2010/0171220 A1 | 7/2010 | Cheng-Lin | |
| 2010/0173494 A1 | 7/2010 | Kobrin | |
| 2010/0203725 A1 | 8/2010 | Choi et al. | |
| 2010/0301480 A1 | 12/2010 | Choi et al. | |
| 2010/0330805 A1 | 12/2010 | Doan et al. | |
| 2011/0049568 A1 | 3/2011 | Lochtefeld et al. | |
| 2011/0057317 A1 | 3/2011 | Koike et al. | |
| 2011/0089393 A1 | 4/2011 | Kuo-Pin et al. | |
| 2011/0207318 A1 | 8/2011 | Usami | |
| 2011/0281417 A1 | 11/2011 | Gordon et al. | |
| 2012/0115302 A1 | 5/2012 | Breitwisch et al. | |
| 2012/0156857 A1 | 6/2012 | Cohen | |
| 2012/0178235 A1 | 7/2012 | Pachamuthu et al. | |
| 2013/0072019 A1 | 3/2013 | Ryan | |
| 2013/0109148 A1 | 5/2013 | Oh et al. | |
| 2013/0241037 A1 | 9/2013 | Jeong et al. | |
| 2013/0264533 A1 | 10/2013 | Cheong et al. | |
| 2013/0334700 A1* | 12/2013 | Singh ................. H01L 23/5222 257/774 |
| 2014/0029181 A1 | 1/2014 | Gstrein | |
| 2014/0264747 A1 | 9/2014 | Barabash | |
| 2014/0264896 A1 | 9/2014 | Wei et al. | |
| 2014/0327140 A1 | 11/2014 | Zhang et al. | |
| 2015/0111374 A1 | 4/2015 | Bao et al. | |
| 2015/0132901 A1 | 5/2015 | Wang et al. | |
| 2015/0137113 A1 | 5/2015 | Yu et al. | |
| 2015/0170956 A1 | 6/2015 | Naik et al. | |
| 2015/0279736 A1 | 10/2015 | Hotta et al. | |
| 2015/0287675 A1 | 10/2015 | Shaviv | |
| 2015/0325622 A1 | 11/2015 | Zhang et al. | |
| 2015/0357439 A1 | 12/2015 | Liu et al. | |
| 2015/0364420 A1 | 12/2015 | Mei et al. | |
| 2015/0371896 A1 | 12/2015 | Chen et al. | |
| 2016/0049427 A1 | 2/2016 | Zang | |
| 2016/0056074 A1 | 2/2016 | Na | |
| 2016/0056104 A1 | 2/2016 | Bouche et al. | |
| 2016/0068710 A1 | 3/2016 | Wang et al. | |
| 2016/0093635 A1 | 3/2016 | Rabkin et al. | |
| 2016/0111342 A1 | 4/2016 | Huang et al. | |
| 2016/0141416 A1 | 5/2016 | Mariani et al. | |
| 2016/0163587 A1 | 6/2016 | Backes et al. | |
| 2016/0163640 A1 | 6/2016 | Edelstein et al. | |
| 2016/0190008 A1 | 6/2016 | Chandrashekar et al. | |
| 2016/0190009 A1 | 6/2016 | Wallace et al. | |
| 2016/0260779 A1 | 9/2016 | Kawashima et al. | |
| 2017/0053863 A1 | 2/2017 | Lu et al. | |
| 2017/0076945 A1 | 3/2017 | Hudson | |
| 2017/0077037 A1 | 3/2017 | Kelly et al. | |
| 2017/0186849 A1 | 6/2017 | Chen et al. | |
| 2017/0263563 A1 | 9/2017 | Dutta et al. | |
| 2017/0271202 A1 | 9/2017 | Xu et al. | |
| 2017/0338149 A1 | 11/2017 | Lin | |
| 2018/0096847 A1 | 4/2018 | Thompson et al. | |
| 2018/0130671 A1 | 5/2018 | Duan et al. | |
| 2018/0144980 A1 | 5/2018 | Basu et al. | |
| 2018/0358260 A1 | 12/2018 | Roy et al. | |
| 2019/0189510 A1 | 6/2019 | Lin et al. | |

FOREIGN PATENT DOCUMENTS

| | | | |
|---|---|---|---|
| JP | 2011233922 A | 11/2011 | |
| KR | 100223334 B1 | 10/1999 | |
| KR | 20000026588 A | 5/2000 | |
| KR | 20020020969 A | 3/2002 | |
| WO | 2016/106092 A1 | 6/2016 | |
| WO | 2017136577 A1 | 8/2017 | |

OTHER PUBLICATIONS

PCT International Search Report and Written Opinion in PCT/US2017/053936 dated Jan. 12, 2018, 10 pages.
PCT International Search Report and Written Opinion in PCT/US2017/059737 dated May 18, 2018, 11 pages.
PCT International Search Report and Written Opinion in PCT/US2017/060367 dated Feb. 22, 2018, 9 pages.
PCT International Search Report and Written Opinion in PCT/US2017/060368 dated Jan. 31, 2018, 11 pages.
PCT International Search Report and Written Opinion in PCT/US2018/019146 dated May 23, 2018, 12 pages.
PCT International Search Report and Written Opinion in PCT/US2018/027284 dated Aug. 2, 2018, 10 pages.
PCT international Search Report and Written Opinion in PCT/US2018/036690 dated Sep. 18, 2018, 9 pages.
PCT International Search Report and Written Opinion in PCT/US2018/048503 dated Dec. 14, 2018, 10 pages.
PCT International Search Report and Written Opinion in PCT/US2018/048504 dated Dec. 13, 2018, 10 pages.

(56) References Cited

OTHER PUBLICATIONS

PCT International Search Report and Written Opinion in PCT/US2018/048509 dated Dec. 13, 2018, 10 pages.
PCT ISR & Written Opinion for PCT/US2018/026026, dated Jul. 26, 2018, 11 pages.

\* cited by examiner

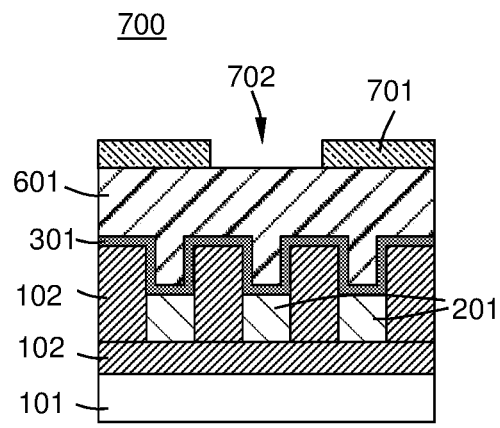
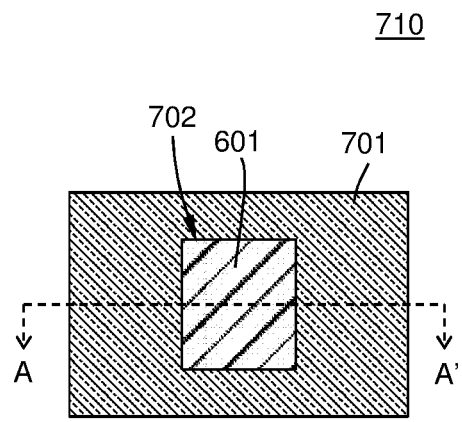
FIG. 7A  FIG. 7B
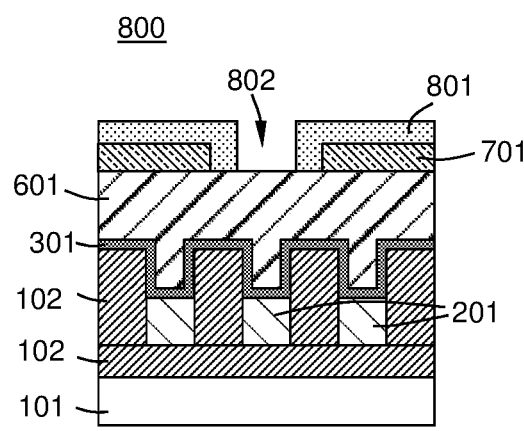
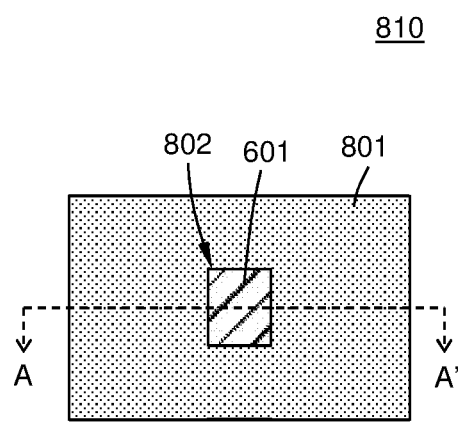
FIG. 8A  FIG. 8B

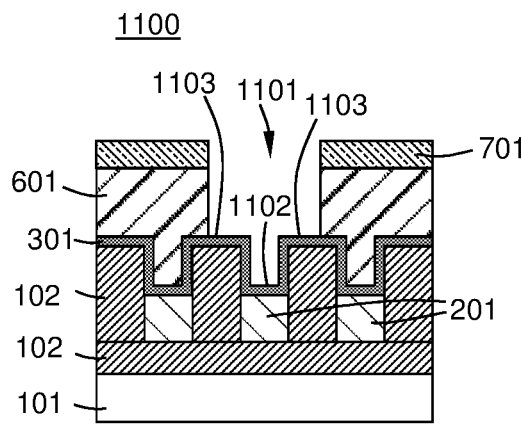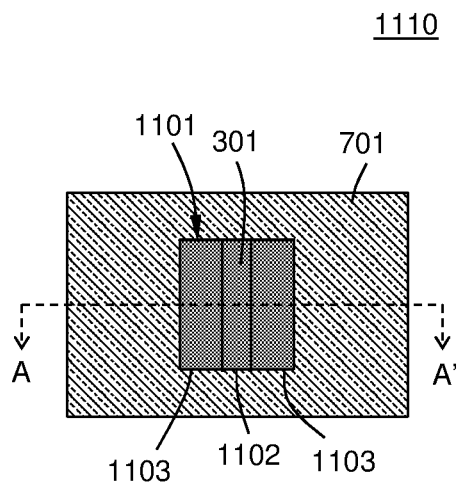
FIG. 11A   FIG. 11B
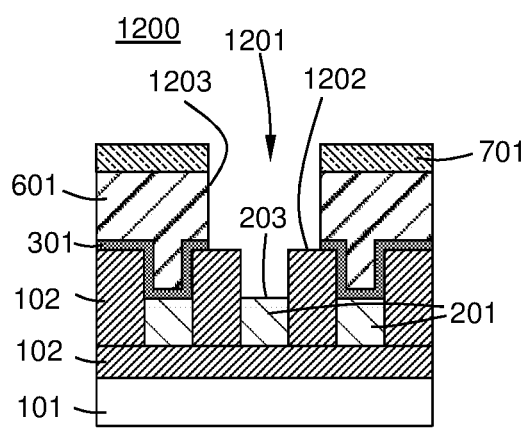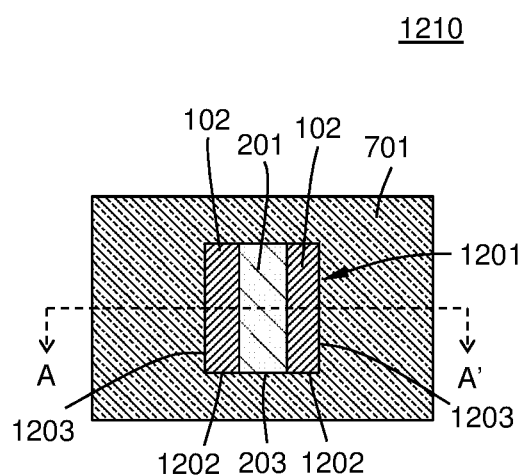
FIG. 12A   FIG. 12B

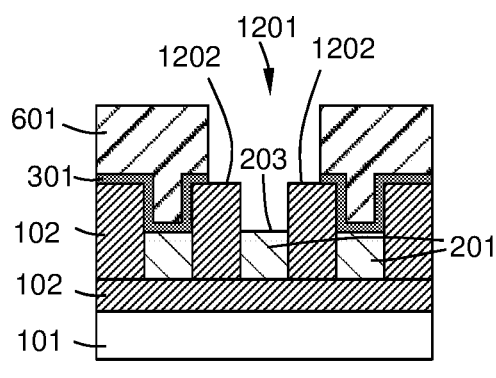
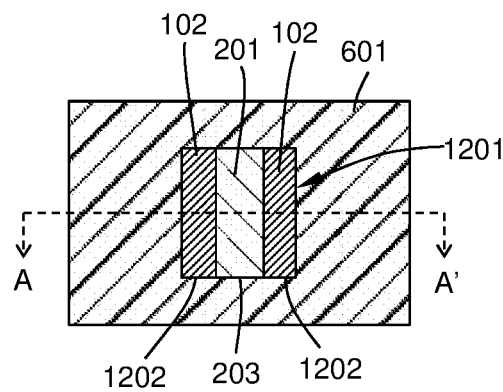
FIG. 13A  FIG. 13B
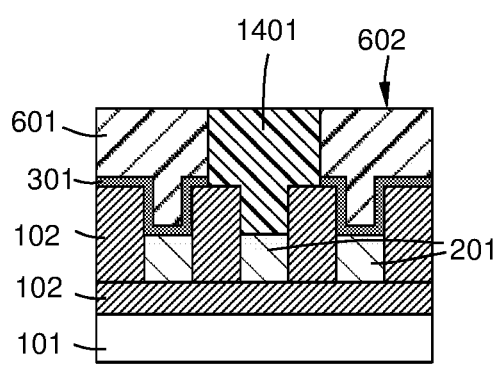
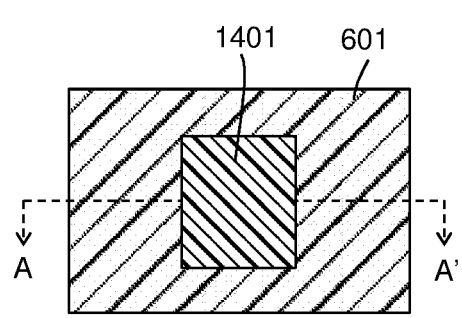
FIG. 14A  FIG. 14B

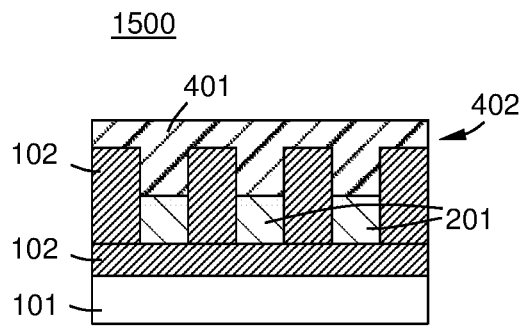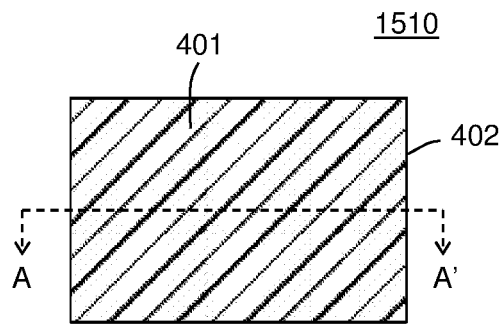
FIG. 15A      FIG. 15B
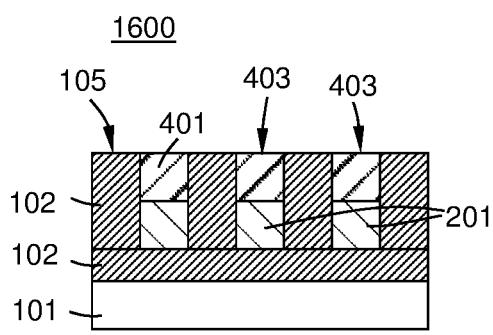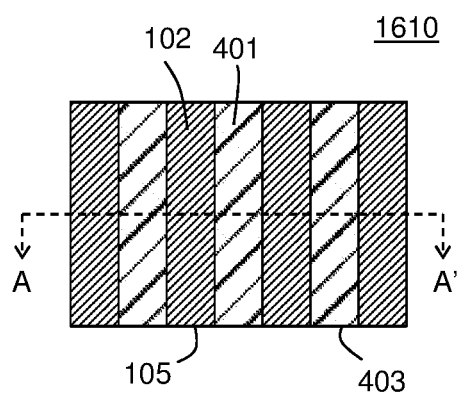
FIG. 16A      FIG. 16B

SELECTIVELY ETCHED SELF-ALIGNED VIA PROCESSES

CROSS-REFERENCE TO RELATED APPLICATIONS

This application claims priority to U.S. Provisional Application No. 62/599,664, filed Dec. 15, 2017, the entire disclosure of which is hereby incorporated by reference herein.

TECHNICAL FIELD

Embodiments of the present disclosure pertain to the field of electronic device manufacturing, and in particular, to an integrated circuit (IC) manufacturing.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the IC decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide the full via self-alignment. In the conventional techniques, the vias formed to connect lines in an upper metallization layer to a lower metallization are often misaligned. Via-line misalignment increases via resistance and leads to potential shorting to the wrong metal line. The via-line misalignment causes device failures, decreases yield and increases manufacturing cost.

Therefore, there is an ongoing need in the art for improved methods for forming self-aligned vias.

SUMMARY

One or more embodiments of the disclosure are directed to methods to provide self-aligned vias. First conductive lines are recessed on a first insulating layer on a substrate. The first conductive lines extend along a first direction on the first insulating layer. A second insulating layer is deposited on the first insulating layer and the recessed first conductive lines. A hardmask is formed on the second insulating layer. The hardmask has a first opening aligned with one of the first conductive lines. A photoresist is formed on the hardmask. The photoresist has a second opening aligned with the first opening. The second insulating layer is partially etched to a depth through the second opening. The photoresist is removed to leave the hardmask with the first opening. The second insulating layer is etched through the first opening to form a via.

Additional embodiments of the disclosure are directed to methods of forming self-aligned vias. A substrate comprising a first insulating layer with a plurality of first conductive lines extending in a first direction is provided. The first conductive lines are recessed so that a top surface of the first conductive lines is a recess depth below a top surface of the first insulating layer. A conformal liner is deposited on the recessed first conductive lines and the first insulating layer. A second insulating layer is deposited on the liner on the first insulating layer and the recessed first conductive lines. A hardmask is formed on the second insulating layer. The hardmask has a first opening aligned with one of the first conductive lines. A photoresist with a second opening aligned with the first opening is formed on the hardmask. The second insulating layer is partially etched to a depth through the second opening. The photoresist is removed to leave the hardmask with the first opening. The second insulating layer is etched through the first opening to expose the liner in the recessed first conductive line. The liner in the first conductive line is removed to form a via.

Further embodiments of the disclosure are directed to methods of forming self-aligned vias. A substrate comprising a first insulating layer with a plurality of first conductive lines extending in a first direction is provided. The first conductive lines are recessed so that a top surface of the first conductive lines is a recess depth below a top surface of the first insulating layer. A second insulating layer is deposited directly on the first insulating layer and the recessed first conductive lines. A hardmask is formed on the second insulating layer. The hardmask has a first opening aligned with one of the first conductive lines. A photoresist is formed on the hardmask. The photoresist has a second opening aligned with the first opening. The second insulating layer is partially etched to a depth through the second opening. The photoresist is removed to leave the hardmask with the first opening. The second insulating layer is etched through the first opening to expose the first conductive line to form a via.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 7A is a view similar to FIG. 6A after forming a hardmask according to one or more embodiment;

FIG. 7B is a top view of the electronic device structure depicted in FIG. 7A;

FIG. 8A is a view similar to FIG. 7A, after forming a photoresist according to one or more embodiment;

FIG. 8B is a top view of the electronic device structure depicted in FIG. 8A;

FIG. 11A is a view similar to FIG. 10A after etching the second insulating layer according to one or more embodiment;

FIG. 11B is a top view of the electronic device structure depicted in FIG. 11A;

FIG. 12A is a view similar to FIG. 11A after removing the liner according to one or more embodiment;

FIG. 12B is a top view of the electronic device structure depicted in FIG. 12A;

FIG. 13A is a view similar to FIG. 12A after removing the hardmask according to one or more embodiment;

FIG. 13B is a top view of the electronic device structure depicted in FIG. 13A;

FIG. 14A is a view similar to FIG. 13A after a depositing a second conductive line according to one or more embodiment;

FIG. 14B is a top view of the electronic device structure depicted in FIG. 14A;

FIG. 15A is a view similar to FIG. 2A, after a second insulating layer is deposited on the liner according to one or more embodiment;

FIG. 15B is a top view of the electronic device structure depicted in FIG. 15A;

FIG. 16A is a view similar to FIG. 15A, after portions of the second insulating layer are removed to expose top portions of the first conductive lines and the first insulating layer according to one or more embodiment;

FIG. 16B is a top view of the electronic device structure depicted in FIG. 16A;

DETAILED DESCRIPTION

Figure 1A:
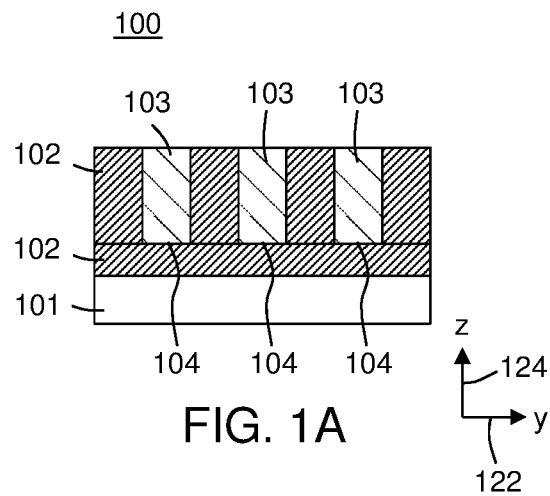
FIG. 1A illustrates a cross-sectional view of an electronic device structure to provide a fully self-aligned via according to one or more embodiment.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Methods and apparatus to provide fully self-aligned vias are described. In some embodiments, a first metallization layer comprising a set of first conductive lines extending along a first direction on a first insulating layer on a substrate is formed. A second insulating layer is formed on the first insulating layer. A second metallization layer comprising a set of second conductive lines on the second insulating layer above the first metallization layer is formed. The set of second conductive lines extend along a second direction. A via is formed between the first metallization layer and the second metallization layer. The via is self-aligned along the second direction to one of the first conductive lines. The via is self-aligned along the first direction to one of the second conductive lines, as described in further detail below. In some embodiments, the first and second directions cross each other at an angle. In some embodiments, the first direction and second direction are substantially orthogonal to each other. In some embodiments, a fully self-aligned via is a via that is self-aligned along at least two directions to the conductive lines in a lower and an upper metallization layer. As used in this specification and the appended claims, the term "self-aligned" means that the subject via or contact is formed at the intersection of adjacent metallization layers so that the via or contact is self-aligned along at least two directions relative to the upper and lower conductive lines.

One or more embodiments of the disclosure advantageously eliminate the via misalignment issues and avoid electrically shorting to the wrong metal line. The fully self-aligned vias provide lower via resistance and capacitance benefits over the conventional vias. Embodiments of the self-aligned vias provide full alignment between the vias and the conductive lines of the metallization layers that are substantially error free and advantageously increase the device yield and/or reduce the device cost.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure maybe practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in a least one embodiment of the present disclosure. Thus, the appearance of the phrases "in one embodiment" or "in an embodiment" in various places throughout the specification are not necessarily all referring to the same embodiment of the disclosure. Furthermore, the particular features, structures, or characteristics may be combined in any suitable manner in one or more embodiments.

Moreover, inventive aspects lie in less than all the features of a single disclosed embodiment of the disclosure. Thus, the claims following the Detailed Description is hereby expressly incorporated into this Detailed Description, with each claim standing on its own as a separate embodiment of this disclosure. While the disclosure has been described in terms of several embodiments, those skilled in the art will recognize that the disclosure if not limited to the embodiments described, but can be practiced with modification and alteration within the spirit and scope of the appended claims. The description is thus to be regarded as illustrative rather than limiting.

Exemplary processes according to one or more embodiments of the disclosure are illustrated in FIGS. 1A through 24B. Each of the Figures is split into an A illustration (e.g., FIG. 1A) and a B illustration (e.g., FIG. 1B). The A illustration for each Figure is a side view of a portion of a device. The B illustration is a top view of the portion of the device shown in the corresponding A illustration showing a cross-section line A-A' upon which the A illustration is shown.

Figure 1B:
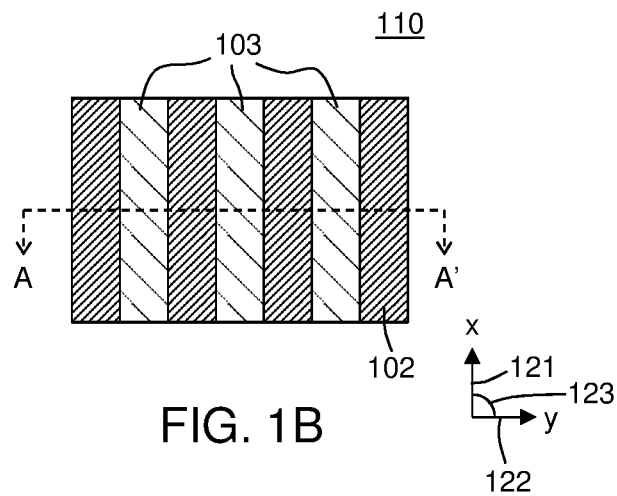
FIG. 1B is a top view of the electronic device structure depicted in FIG. 1A.

FIGS. 1A and 1B illustrate a cross-sectional view 100 and a top view 110, respectively, of an electronic device structure to provide a fully self-aligned via according to one or more embodiment of the disclosure. The cross-sectional view 110 is along an axis A-A', as depicted in FIG. 1A. A lower metallization layer (Mx) comprises a set of first conductive lines 103 that extend along an X axis (direction) 121 on a first insulating layer 102 on a substrate 101, as shown in FIGS. 1A and 1B. As shown in FIG. 1B, X axis (direction) 121 crosses Y axis (direction) 122 at an angle 123. In some embodiments, angle 123 is about 90 degrees. In another embodiment, angle 123 is an angle that is other than a 90-degree angle. The coordinate axis shown in FIG. 1A is representative of the coordinate axis for each of the A illustrations. Similarly, the coordinate axis shown in FIG. 1B is representative of the coordinate axis for each of the B illustrations. The coordinate axis of FIG. 1A illustrates the Y axis (direction 122) and the Z axis (direction 124). Components displaced along the Z axis (direction 124) may be referred to as being above or below, or similar. However, this is merely for descriptive purposes and the skilled artisan will recognize that the electronic device structure can be in any orientation.

The first insulating layer 102 comprises trenches 104. The trenches 104 have bottoms and sidewalls. The bottoms and sidewalls are bounded by the first insulating layer 102. The first conductive lines 103 are deposited in trenches 104 formed in the first insulating layer 102.

In an embodiment, the substrate 101 comprises a semiconductor material, e.g., silicon (Si), carbon (C), germanium (Ge), silicon germanium (SiGe), gallium arsenide (GaAs), InP, GaAs, InGaAs, InAlAs, other semiconductor material, or any combination thereof. In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate can be, e.g., an organic. A ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, substrate 101 includes one or more metallization interconnect layers for integrated circuits. In at least some embodiments, the substrate 101 includes interconnects, for example, vias, configured to connect the metallization layers. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In some embodiments, the substrate includes one or more buffer layers to accommodate for a lattice mismatch between the substrate 101 and one or more layers above substrate 101 and to confine lattice dislocations and defects.

First insulating layer 102 can be any material suitable to insulate adjacent devices and prevent leakage. In some embodiments, electrically insulating layer 102 is an oxide layer, e.g., silicon dioxide, or any other electrically insulating layer determined by an electronic device design. In some embodiments, first insulating layer 102 comprises an interlayer dielectric (ILD). In some embodiments, first insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof.

In some embodiments, first insulating layer 102 includes a dielectric material having a k-value less than 5. In some embodiments, first insulating layer 102 includes a dielectric material having a k-value less than 2. In some embodiments, first insulating layer 102 includes a nitride, oxide, a polymer, phosphosilicate glass, fluourosilicate (SiOF) glass, organosilicate glass (SiOCH), other electrically insulating layer determined by an electronic device design, or any combination thereof. In some embodiments, first insulating layer 102 may include polyimide, epoxy, photodefinable materials, such as benzocyclobutene (BCB), and WPR-series materials, or spin-on-glass.

In some embodiments, first insulating layer 102 is a low-k interlayer dielectric to isolate one metal line from other metal lines on substrate 101. In some embodiments, the thickness of the first insulating layer 102 is in an approximate range from about 10 nanometers (nm) to about 2 microns (μm).

In an embodiment, first insulating layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In some embodiments, the lower metallization layer Mx comprising first conductive lines 103 (i.e., metal lines) is a part of a back end metallization of the electronic device. In some embodiments, the first insulating layer 102 is patterned and etched using a hard mask to form trenches 104 using one or more patterning and etching techniques known to one of ordinary skill in the art of microelectronic device manufacturing. In some embodiments, the size of trenches in the first insulating layer 102 is determined by the size of conductive lines formed later on in a process.

In some embodiments, forming the first conductive lines 103 involves filling the trenches 104 with a layer of conductive material. In some embodiments, a base layer (not shown) is first deposited on the internal sidewalls and bottom of the trenches 104, and then the conductive layer is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the first insulating layer 102. Additionally, the conductive barrier layer can be used to provide adhesion for the seed layer (e.g., copper).

In some embodiments, to form the base layer, the conductive barrier layer is deposited onto the sidewalls and bottom of the trenches 104, and then the seed layer is deposited on the conductive barrier layer. In another embodiment, the conductive base layer includes the seed layer that is directly deposited onto the sidewalls and bottom of the trenches 104. Each of the conductive barrier layer and seed layer may be deposited using any think film deposition technique known to one of ordinary skill in the art of semiconductor manufacturing, e.g., sputtering, blanket deposition, and the like. In some embodiments, each of the conductive barrier layer and the seed layer has the thickness in an approximate range from about 1 nm to about 100 nm. In some embodiments, the barrier layer may be a thin dielectric that has been etched to establish conductivity to the metal layer below. In some embodiments, the barrier layer may be omitted altogether and appropriate doping of the copper line may be used to make a "self-forming barrier".

In some embodiments, the first conductive line 103 (e.g., copper) is deposited onto the seed layer of base layer of copper, by an electroplating process. In some embodiments, the conductive layer is deposited into the trenches 104 using a damascene process known to one of ordinary skill in the art of microelectronic device manufacturing. In some embodiments, the conductive layer is deposited onto the seed layer in the trenches 104 using a selective deposition technique, such as but not limited to electroplating, electroless, A CVD, PVD, MBE, MOCVD, ALD, spin-on, or other deposition techniques know to one of ordinary skill in the art of microelectronic device manufacturing.

In some embodiments, the choice of a material for conductive layer for the first conductive lines 103 determines the choice of a material for the seed layer. For example, if the material for the first conductive lines 103 includes copper, the material for the seed layer also includes copper. In some embodiments, the first conductive lines 103 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten(W), vandium (V), molybdenum (Mo), palladium (Pd), gold (Au), silver (Ag), platinum (Pt), indium (In), tin (Sn), lead (Pd), antimony (Sb), bismuth (Bi), zinc (Zn), cadmium (Cd), or any combination thereof.

Suitable conductive materials that may be used for the first conductive lines 103 of the metallization layer Mx include, but are not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In some embodiments, portions of the conductive layer and the base layer are removed to even out top portions of the first conductive lines 103 with top portions of the first insulating layer 102 using a chemical-mechanical polishing ("CMP") technique known to one of ordinary skill in the art of microelectronic device manufacturing.

In one non-limiting example, the thickness of the first conductive lines 103, along Z axis direction 124, is in an approximate range from about 10 nm to about 1000 nm. In some embodiments, the thickness of the first conductive lines 103 is in the range of about 20 nm to about 200 nm. In one non-limiting example, the width of the first conductive lines 103 is in the range of about 5 nm to about 500 nm. In one non-limiting example, the spacing (pitch) between adjacent first conductive lines 103 is in the range of about 2 nm to about 500 nm. In some embodiments, the spacing (pitch) between the adjacent first conductive lines 103 is in the range of about 5 nm to about 50 nm.

In some embodiments, the lower metallization layer Mx is configured to connect to other metallization layers (not shown). In an embodiment, the metallization layer Mx is configured to provide electrical contact to electronic devices, e.g., transistor, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Figure 2A:
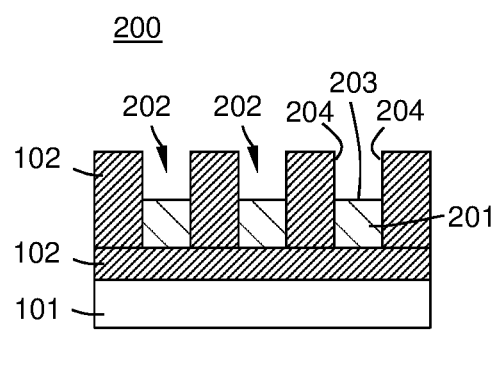
FIG. 2A is a view similar to FIG. 1A, after the conductive lines are recessed according to one or more embodiment.
Figure 2B:
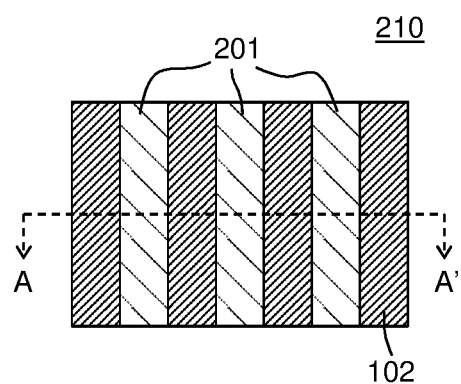
FIG. 2B is a top view of the electronic device structure depicted in FIG. 2A.

FIG. 2A is a view 200 similar to view 100 of FIG. 1A, after the first conductive lines 103 are recessed according to one or more embodiment. FIG. 2B is a view 210 similar to FIG. 1B, after the first conductive lines 103 are recessed according to one embodiment. The first conductive lines 103 are recessed to a predetermined recess depth to form recessed first conductive lines 201. As shown in FIGS. 2A and 2B, trenches 202 are formed in the insulating layer 102. Each trench 202 has sidewalls 204 that are portions of insulating layer 102 and a bottom that is a top surface 203 of the recessed first conductive line 201.

In some embodiments, the depth (i.e., along the Z axis) of the trenches 202 is in the range of about 5 nm to about 500 nm, or in the range of about 10 nm to about 250 nm, or in the range of about 15 nm to about 200 nm, or in the range of about 20 nm to about 100 nm. In some embodiments, the recessed first conductive lines 201 have a height (i.e., along the Z axis) that is in the range of about 10% to about 90% of the initial height of the first conductive lines 103 before recessing. In some embodiments, the recessed first conductive lines 201 have a height in the range of about 20% to about 80%, or in the range of about 30% to about 70%, or in the range of about 40% to about 60%, or about 50% of the initial height of the first conductive lines 103 before recessing. In some embodiments, the first conductive lines 103 are recessed using one or more of wet etching, dry etching, or a combination thereof techniques known to one of ordinary skill in the art of electronic device manufacturing.

In some embodiments, the first conductive lines 201 are formed on a first insulating layer 102 comprises one or more of flowable silicon oxide (f-SiO) or an ultra low-k dielectric material. The first conductive lines 201 of some embodiments are recessed selectively without damaging the ultra low-k dielectric material. In some embodiments, the first conductive lines 201 are recessed while maintaining a flat top surface 203. As used in this manner, the term "flat" means that the edges of the top surface 203 adjacent the sidewalls 204 do not change height relative to the center of the top surface 203 by more than 10%, 5% or 2% of the depth that the first conductive lines 201 are recessed.

Figure 3A:
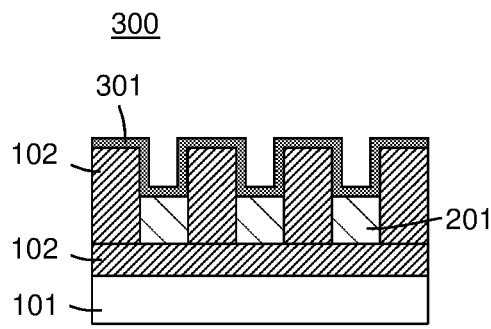
FIG. 3A is a view similar to FIG. 2A, after a liner is deposited on the recessed conductive lines according to one or more embodiment.
Figure 3B:
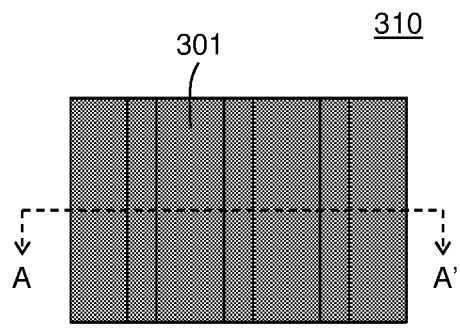
FIG. 3B is a top view of the electronic device structure depicted in FIG. 3A.

FIG. 3A is a view 300 similar to FIG. 2A, and FIG. 3B is a view 310 similar to FIG. 2B, after a liner 301 is deposited on the recessed conductive lines 201 according to one embodiment. Liner 301 is deposited on the bottom and sidewalls of the trenches 202, as shown in FIG. 3. The liner 301 is an optional component and may not be incorporated in all embodiments of the disclosure. In the embodiment shown in FIGS. 3A and 3B, the liner 301 is deposited on the recessed first conductive lines 201 and the first insulating layer 102 prior to depositing a second insulating layer (as discussed below). Another embodiment of the method performed without a liner 301 is described below.

In some embodiments, liner 301 is deposited to protect the first conductive lines 201 from changing properties in a later process (e.g., during tungsten deposition, or other processes). In some embodiments, liner 301 is a conductive liner. In another embodiment, liner 301 is a non-conductive liner. In some embodiments, when liner 301 is a non-conductive liner, the liner 301 is removed later on in a process, as described in further detail below. In some embodiments, the liner helps avoid exposure of the first conductive lines 201 to a low-k dielectric (including ultra low-k dielectrics) and/or serves as an etch stop layer for a self-guided via etch.

The liner 301 can be any suitable material depending on, for example, the composition of the first conductive lines 201, the first insulating layer 102 and subsequent second insulating layer 401. In some embodiments, the liner 301 is a dielectric material. In some embodiments, liner 301 comprises one or more of titanium nitride (TiN), titanium (Ti), tantalum (Ta), tantalum nitride (TaN), silicon carbonitride (SiCN), silicon carbide (SiC), silicon nitride (SiN), aluminum oxide (AlO), aluminum nitride (AlN), hafnium oxide (HfO), titanium oxide (TiO). The skilled artisan will recognize that the chemical formula for the various films are non-stoichiometric. For example, a hafnium oxide film is denoted HfO, which merely means that the film comprises hafnium and oxygen and not a stoichiometric amount of the elements. In some embodiments, each of the elements of the formula is present in an amount greater than or equal to about 5%, 10%, 15%, 20%, 25%, 30%, 35%, 40% or 45%, on an atomic basis. In an embodiment, the liner 301 is deposited to the thickness in the range of about 0.5 nm to about 10 nm.

In an embodiment, the liner 301 is deposited using an atomic layer deposition (ALD) technique. In some embodiments, the liner 301 is deposited using one of deposition techniques, such as but no limited to a CVD, PVD, MBE, MOCVD, spin-on, or other liner deposition techniques know to one of ordinary skill in the art of microelectronic device manufacturing. In some embodiments, the liner 301 is deposited as a conformal film. As used in this manner, the term "conformal" means that the thickness of the liner 301 at any point on the sidewalls 204 of the trench 202 or top surface 203 of the conductive line 201 does not vary by more than ±10%, ±5%, ±2% or ±1% relative to the average thickness of the liner 301.

Figure 4A:
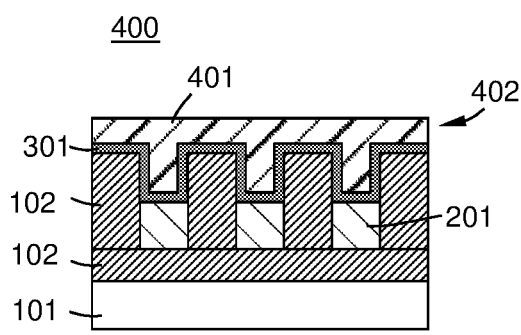
FIG. 4A is a view similar to FIG. 3A, after a second insulating layer is deposited on the liner according to one or more embodiment.
Figure 4B:
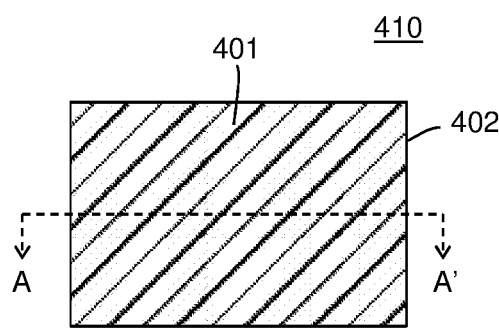
FIG. 4B is a top view of the electronic device structure depicted in FIG. 4A.

FIG. 4A is a view 400 similar to FIG. 3A, and FIG. 4B is a view 410 similar to FIG. 3B, after a second insulating layer 401 is deposited on the liner 301 according to one embodiment. The second insulating layer 401 is deposited as a gapfill layer to fill the gaps formed by the recessed first conductive lines 201 in the trenches 202 with the liner 301 on top. The second insulating layer 401 is deposited so that an overburden 402 is formed on top of the liner 301 on the top of the first insulating layer 102. The overburden can be any suitable thickness and may be removed in a subsequent process. In some embodiments, the overburden is a known amount and is not removed by the process described below in FIGS. 5A-6B.

The second insulating layer 401 is a low-k dielectric material. In some embodiments, the second insulating layer 401 comprises a flowable silicon oxycarbide (f-SiOC) film or a low-k gapfill film. In some embodiments, the second insulating layer 401 is deposited using one of deposition techniques, such as but not limited to an ALD, a CVD, PVD, MBE, MOCVD, spin-on or other liner deposition techniques known to one of ordinary skill in the art of microelectronic device manufacturing.

Figure 5A:
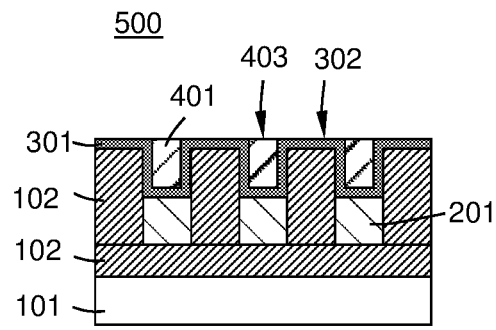
FIG. 5A is a view similar to FIG. 4A, after portions of the second insulating layer are removed to expose top portions of the liner according to one or more embodiment.
Figure 5B:
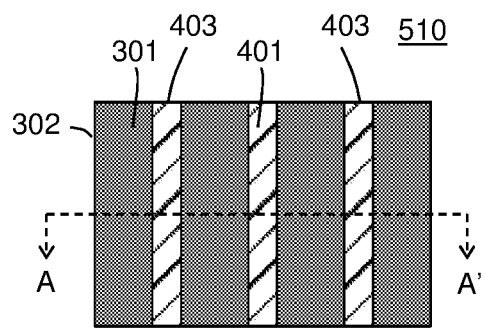
FIG. 5B is a top view of the electronic device structure depicted in FIG. 5A.

FIG. 5A is a view 500 similar to FIG. 4A, and FIG. 5B is a view 510 similar to FIG. 4B, after portions of the second insulating layer 401 are removed to expose top portions 302 of the liner 301 according to one embodiment. In some embodiments, the planarization process stops at the liner 301 to leave the top surface 403 of the second insulating layer 401 substantially coplanar with the top portions 302 of the liner 301. In the embodiment illustrated, in which there is a liner 301, the planarization process does not expose the first insulating layer 102 through the liner 301. The second insulating layer 401 can be removed using one of the chemical-mechanical polishing (CMP) techniques known to one of ordinary skill in the art of microelectronic device manufacturing.

Figure 6A:
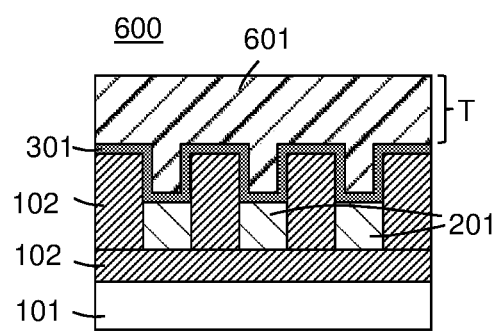
FIG. 6A is a view similar to FIG. 5A, after depositing the second insulating layer to a thickness according to one or more embodiment.
Figure 6B:
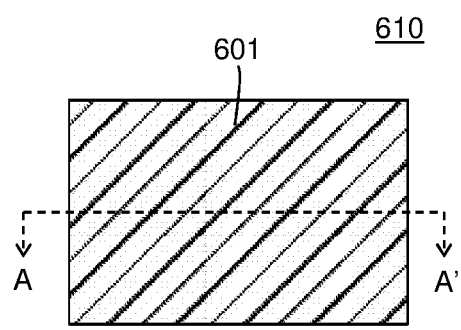
FIG. 6B is a top view of the electronic device structure depicted in FIG. 6A.

FIG. 6A is a view 600 similar to FIG. 5A, and FIG. 6B is a view 610 similar to FIG. 5B, after additional second insulating layer 601 is deposited on the planarized second insulating layer 401 and liner 301. The additional second insulating layer 601 can be the same composition as the second insulating layer 401 or a different composition. In the embodiment described in the Figures, the additional second insulating layer 601 is the same material as the second insulating layer 401 so that the combination of the second insulating layer 401 in the gaps of the liner 301 forms a seamless layer with the additional second insulating layer 601 and is referred to as the second insulating layer 601.

The second insulating layer 601 is formed so that there is a thickness T of the second insulating layer 601 on the top of the liner 301. In some embodiments, the thickness of the second insulating layer is about the same thickness that will be used in a later trench depth in a dual damascene structure.

In some embodiments, second insulating layer 601 comprises one or more of a flowable silicon oxide (f-SiO) layer. In at least some embodiments, second insulating layer 601 comprises an oxide layer, e.g., silicon dioxide, or any other electrically insulating layer determined by an electronic device design. In some embodiments, second insulating layer 601 is an interlayer dielectric (ILD). In some embodiments, second insulating layer 601 is a low-k dielectric that includes, but is not limited to, materials such as, e.g., silicon dioxide, silicon oxide, a carbon based material, e.g, a porous carbon film, carbon doped oxide ("CDO"), e.g., carbon doped silicon dioxide, porous silicon dioxide, porous silicon oxide carbide hydride (SiOCH), silicon nitride, or any combination thereof. In some embodiments, second insulating layer 601 is a dielectric material having k-value less than 3. In some embodiments, second insulating layer 601 is a dielectric material having k-value in an approximate range from about 2.2 to about 2.7. In some embodiments, second insulating layer 601 includes a dielectric material having k-value less than 2. In some embodiments, second insulating layer 601 represents one of the insulating layers described above with respect to insulating layer 102.

In some embodiments, second insulating layer 601 is a low-k interlayer dielectric to isolate one conductive line 201 from adjacent conductive lines 201. In some embodiments, second insulating layer 601 is deposited using one of deposition techniques, such as but not limited to a CVD, spin-on, an ALD, PVD. MBE, MOCVD, or other low-k insulating layer deposition techniques known to one of ordinary skill in the art of microelectronic device manufacturing.

FIG. 7A is a view 700 similar to FIG. 6A, and FIG. 7B is a view 710 similar to FIG. 6B after a hardmask 701 is formed on second insulating layer 601 according to one embodiment. In some embodiments, hardmask 701 is a metallization layer hardmask. In some embodiments, the hardmask 701 has a first opening 702 that is aligned in the Z axis over one of the first conductive lines 201. In some embodiments, the hardmask 701 material is deposited on the second insulating layer 601 and the hardmask 701 is patterned using trench lithography to form one or more first opening 702.

The dimensions and shape of the first openings 702 in the hardmask 701 can vary depending on the configuration of the electronic device structure being formed. In some embodiments, the first openings 702 are wider than the first conductive line 201 aligned with the first opening 702.

The hardmask 701 can be any suitable material including, but not limited to, titanium nitride, tungsten carbide or tungsten borocarbide. In some embodiments, hardmask 701 is a carbon hardmask layer, a metal oxide hardmask layer, a metal nitride hardmask layer, a silicon nitride hardmask layer, a silicon oxide hardmask layer, a carbide hardmask layer, or other hardmask layer known to one of ordinary skill in the art of microelectronic device manufacturing. In some embodiments, the hardmask 701 is formed using one or more hard mask patterning techniques known to one of ordinary skill in the art of microelectronic device manufacturing.

FIG. 8A is a view 800 similar to FIG. 7A, and FIG. 8B is a view 810 similar to FIG. 7B, after a photoresist 801 is formed on hardmask 701. The photoresist 801 includes a second opening 802 aligned with the first opening 702 so that the second opening 802 is formed above one of the first conductive lines 201.

In some embodiments, forming the photoresist 801 on the hardmask 701 comprises a selective deposition process where the photoresist 801 material is deposited substantially only on the hardmask 701 and not on the second insulating layer 601 exposed through the first opening 702. In some embodiments, the photoresist 801 is formed as a conformal layer of the photoresist material on the hardmask 701 and the second insulating layer 601 is exposed through the first opening 702 and second opening 802 through lithographic patterning. The size of the second opening 802 can be the same as the size of the first opening 702 or different. In the embodiment illustrated in the Figures, the photoresist 801 is selectively deposited on the hardmask 701 so that the sides of the first opening 702 are covered and creating a smaller second opening 802. In some embodiments, the size and dimensions of the second opening 802 are greater than the width of the first conductive line 201 with which the second opening 802 is aligned.

In some embodiments, the photoresist 801 includes a bottom anti-reflective coating (BARC) layer. In some embodiments, photoresist 801 is deposited using one of deposition techniques, such as but not limited to, a CVD, PVD, MBE, PECVD, spin-on, or other insulating layer deposition techniques known to one of ordinary skill in the art of microelectronic device manufacturing. In some embodiments, the second opening 802 is formed using one or more of the patterning and etching techniques known to one of ordinary skill in the art of microelectronic device manufacturing.

Figure 9A:
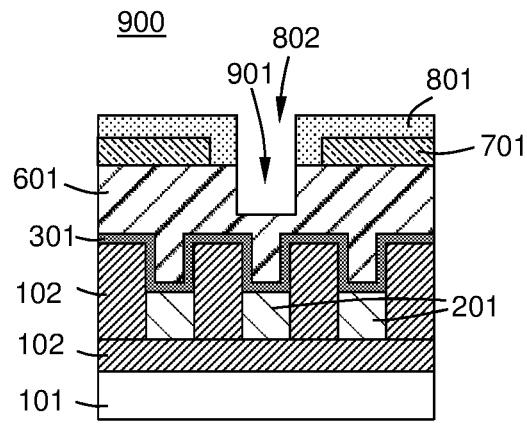
FIG. 9A is a view similar to FIG. 8A after partially etching the second insulating layer according to one or more embodiment.
Figure 9B:
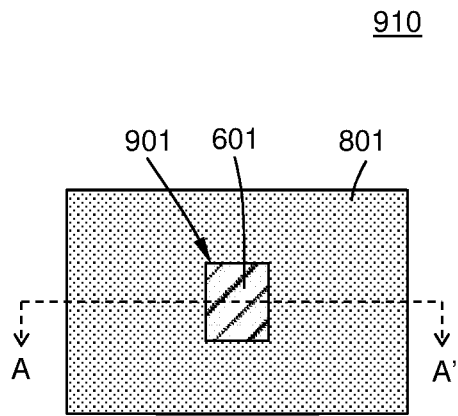
FIG. 9B is a top view of the electronic device structure depicted in FIG. 9A.

FIG. 9A is a view 900 similar to FIG. 8A, and FIG. 9B is a view 910 similar to FIG. 8B, after the second insulating layer 601 is partially etched through the second opening 802 to form opening 901. In some embodiments, the second insulating layer 601 is selectively etched through second opening 802 to form an opening 901 according to one embodiment. In some embodiments, the etch process used to remove portions of the second insulating layer 601 is selective to the second insulating layer 601 relative to one or more of the liner 301 or the first insulating layer 102.

Figure 10A:
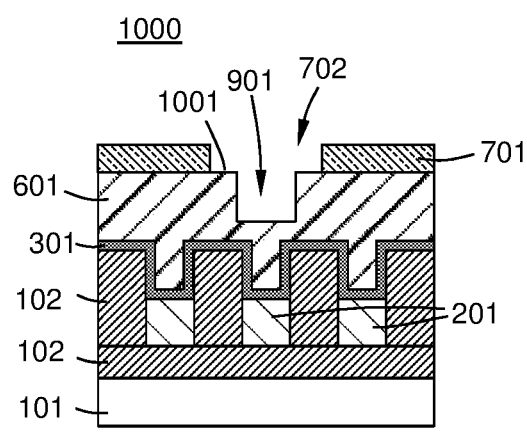
FIG. 10A is a view similar to FIG. 9A after removing the photoresist according to one or more embodiment.
Figure 10B:
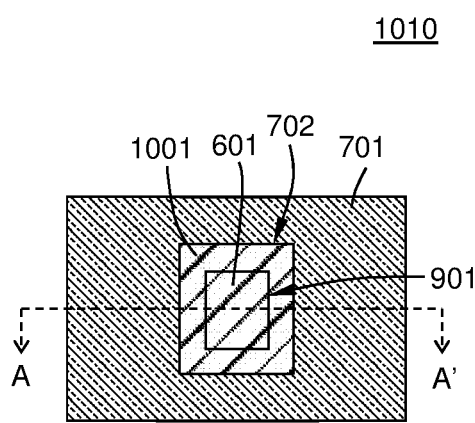
FIG. 10B is a top view of the electronic device structure depicted in FIG. 10A.

FIG. 10A is a view 1000 similar to FIG. 9A, and FIG. 10B is a view 1010 similar to FIG. 9B, after removal of the photoresist 801 to leave hardmask 701 with first opening 702 on the second insulating layer 601. In the embodiment shown, where the second opening 802 was smaller than the first opening 702, removing the photoresist 801 exposes a top surface 1001 of the second insulating layer 601. In embodiments where the first opening 702 and the second opening 802 are the same size, a top surface 1001 of the second insulating layer 601 is not exposed.

In some embodiments, removing the photoresist 801 comprises a process that is selective to the photoresist 801 relative to the hardmask 701 and the second insulating layer 601. In some embodiments, photoresist 801 is removed using one or more of the removal techniques known to one of ordinary skill in the art of microelectronic device manufacturing.

FIG. 11A is a view 1100 similar to FIG. 10A, and FIG. 11B is a view 1110 similar to FIG. 10B, after etching the second insulating layer 601 through the first opening 702 to form trench 1101. The etch process of some embodiments is selective to the second insulating material 601 relative to the liner 301 or the first insulating layer 102, so that the etch process stops at the liner 301. In the embodiment illustrated, an isotropic etch process through first opening 702 exposes the liner 301 on top 1102 of the first conductive line 201 aligned with the first opening 702 and the liner 301 on top 1103 of the first insulating layer 102 adjacent the first conductive line 201. In some embodiments, etching the second insulating layer 601 is a self-guided process and is confined to a recess trench 1101 aligned with one of the first conductive lines 201. In some embodiments, etching the second insulating layer 601 is accomplished using one or more of the removal techniques known to one of ordinary skill in the art of microelectronic device manufacturing.

FIG. 12A is a view 1200 similar to FIG. 11A, and FIG. 12B is a view 1210 similar to FIG. 11B, after removal of the liner 301 exposed through trench 1101 to form via 1201. The liner 301 is removed after etching through the second insulating layer 601 through the first opening 702 to expose the top surface 203 of the first conductive line 201 aligned with the first opening 702 and the sidewall 1203 of the via 1201. In some embodiments, removal of the liner 301 comprises a selective etch process that is selective to the liner 301 relative to the second insulating layer 601, first insulating layer 102 and first conductive line 201. In some embodiments, the liner 301 is removed by one or more of a dry removal process or a wet removal process. Removing the liner 301 increases the critical dimension (i.e., width of the via above the exposed first conductive line 201) for further processing. In some embodiments, the liner 301 is removed using one or more of the removal techniques known to one of ordinary skill in the art of microelectronic device manufacturing.

FIG. 13A is a view 1300 similar to FIG. 12A, and FIG. 13B is a view 1310 similar to FIG. 12B, after removal of the hardmask 701 from the second insulating layer 601. Removal of the hardmask 701 leaves via 1201 with the top surface 203 of the first conductive line 201 and top surface 1202 of the adjacent first insulating layer 102. Removal of the hardmask 701 can be done using a process that is selective to the hardmask 701 relative to the first conductive line 201, first insulating layer 102 and second insulating layer 601. In some embodiments, removal of the hardmask 701 occurs at the same time as removal of the liner 301 so that the process is selective for the hardmask 701 and liner 301 relative to the first insulating layer 102, second insulating layer 601 and first conductive line 201. In some embodiments, hardmask 701 is removed using one or more of the mask layer removal techniques known to one of ordinary skill in the art of microelectronic device manufacturing.

FIG. 14A is a view 1400 similar to FIG. 13A, and FIG. 14B is a view 1410 similar to FIG. 13B, after a second conductive line 1401 is deposited into via 1201. In some embodiments, forming the second conductive line 1401 involves filling the via 1201 with a layer of conductive material. In some embodiments, a base layer (not shown) is first deposited on the internal sidewalls and bottom of the via 1201 and then the conductive layer is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g, copper).

In some embodiments, to form the base layer, the conductive barrier layer is deposited onto the sidewalls and bottom of the trenches, and then the seed layer is deposited on the conductive barrier layer. In another embodiment, the conductive base layer includes the seed layer that is directly deposited onto the sidewalls and bottom of the trenches. Each of the conductive barrier layer and seed layer may be deposited using any thin film deposition technique known to one of ordinary skill in the art of semiconductor manufacturing, e.g., sputtering, blanket deposition, and the like. In some embodiments, each of the conductive barrier layer and the seed layer has the thickness in an approximate range from about 1 nm to about 100 nm. In some embodiments, the barrier layer may be a thin dielectric that has been etched to establish conductivity to the metal layer below. In some embodiments, the barrier layer may be omitted altogether and appropriate doping of the copper line may be used to make a "self-forming barrier".

In some embodiments, the conductive layer e.g., copper, is deposited onto the seed layer of base later of copper, by an electroplating process. In some embodiments, the conductive layer is deposited into the trenches using a damascene process known to one of ordinary skill in the art of microelectronic device manufacturing. In some embodiments, the conductive layer is deposited onto the seed layer in the trenches and in the opening using a selective deposition technique, such as but not limited to electroplating, electroless, a CVD, PVD, MBE, MOCVD, ALD, spin-on, or other deposition techniques known to one of ordinary skill in the art of microelectronic device manufacturing.

In some embodiments, the choice of a material for second conductive lines 1401 determines the choice of a material for the seed layer. For example, if the material for the second conductive lines 1401 includes copper, the material for the seed layer may also include copper. In some embodiments, the second conductive line 1401 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof. In some embodiments, examples of the conductive materials that may be used for the conductive lines 1401 include, but not limited to, metal alloys, metal carbides, e.g., hafnium carbide, zirconium carbide, titanium carbide, tantalum carbide, aluminum carbide, other conductive materials, or any combination thereof.

In some embodiments, depositing the second conductive line 1401 comprises depositing a second conductive material in the via 1201 and on the top surface 602 of the second insulating layer 601, forming an overburden. The portions of the conductive material on the top surface 602 (i.e., the overburden) can be removed using a chemical-mechanical polishing ("CMP") technique known to one of ordinary skill in the art of microelectronic device manufacturing.

In some embodiments, the thickness (measured along the Z axis direction) of the second conductive lines 1401 is in an approximate range from about 15 nm to about 1000 nm. In some embodiments, the thickness of the conductive lines 1401 is from about 20 nm to about 200 nm. In some embodiments, the width (measured along the Y axis direction) of the conductive lines 1401 is in an approximate range from about 5 nm to about 500 nm. In some embodiments, the spacing (pitch) between the conductive lines 1401 (measured along the Y axis direction) is from about 2 nm to about 500 nm, or in the range of about 5 nm to about 50 nm.

Another embodiment of the disclosure is described with respect to FIGS. 15A through 24B. In this embodiment, the process does not includes liner 301. Similar components of FIGS. 15A through 24B to those of FIGS. 1A through 14B use the same reference numerals.

FIG. 15A is a view 1500 similar to FIG. 2A, and FIG. 15B is a view 1510 similar to FIG. 2B, after a second insulating layer 401 is deposited on the first insulating layer 102 and the first conductive lines 201 according to one embodiment. The second insulating layer 401 is deposited as a gapfill layer to fill the gaps formed by the recessed first conductive lines 201 in the trenches 202. The second insulating layer 401 is deposited so that an overburden 402 is formed on top of the first insulating layer 102. The overburden can be any suitable thickness and may be removed in a subsequent process. In some embodiments, the overburden is a known amount and is not removed by the process described below in FIGS. 16A-17B.

The second insulating layer 401 is a low-k dielectric material. In some embodiments, the second insulating layer 401 comprises a flowable silicon oxycarbide (f-SiOC) film or a low-k gapfill film. In some embodiments, the second insulating layer 401 is deposited using one of deposition techniques, such as but not limited to an ALD, a CVD, PVD, MBE, MOCVD, spin-on or other liner deposition techniques known to one of ordinary skill in the art of microelectronic device manufacturing.

FIG. 16A is a view 1600 similar to FIG. 15A, and FIG. 16B is a view 1610 similar to FIG. 15B, after the overburden 402 of the second insulating layer 401 are removed to expose the top surface 105 of the first insulating layer 102 and the top surface 403 of the first conductive lines 201 according to one embodiment. In some embodiments, the planarization process stops to leave the top surface 403 of the second insulating layer 401 substantially coplanar with the top surface 105 of the first insulating layer 102. The overburden 402 of the second insulating layer 401 can be removed using one of the chemical-mechanical polishing (CMP) techniques known to one of ordinary skill in the art of microelectronic device manufacturing.

Figure 17A:
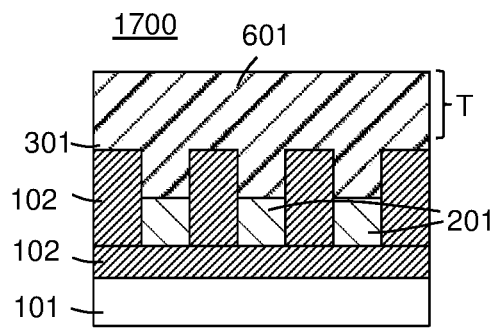
FIG. 17A is a view similar to FIG. 16A, after depositing the second insulating layer to a thickness according to one or more embodiment.
Figure 17B:
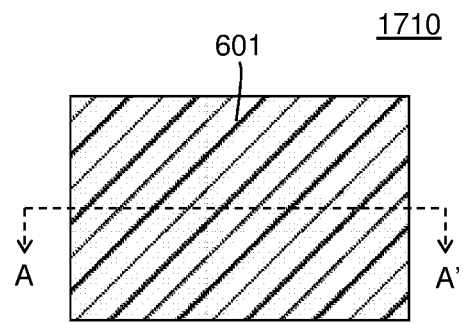
FIG. 17B is a top view of the electronic device structure depicted in FIG. 17A.

FIG. 17A is a view 1700 similar to FIG. 16A, and FIG. 17B is a view 1710 similar to FIG. 16B, after additional second insulating layer 601 is deposited on the planarized top surface 105 of the first insulating layer 102 and the top surface 403 of the second insulating layer 401. The additional second insulating layer 601 can be the same composition as the second insulating layer 401 or a different composition. In the embodiment described in the Figures, the additional second insulating layer 601 is the same material as the second insulating layer 401 so that the combination forms a seamless layer and is referred to as the second insulating layer 601.

The second insulating layer 601 is formed so that there is a thickness T of the second insulating layer 601 on the top of the liner 301. In some embodiments, the thickness of the second insulating layer is about the same thickness that will be used in a later trench depth in a dual damascene structure.

In some embodiments, second insulating layer 601 comprises one or more of a flowable silicon oxide (f-SiO) layer. In at least some embodiments, second insulating layer 601 comprises an oxide layer, e.g., silicon dioxide, or any other electrically insulating layer determined by an electronic device design. In some embodiments, second insulating layer 601 is an interlayer dielectric (ILD). In some embodiments, second insulating layer 601 is a low-k dielectric that includes, but is not limited to, materials such as, e.g., silicon dioxide, silicon oxide, a carbon based material, e.g, a porous carbon film, carbon doped oxide ("CDO"), e.g., carbon doped silicon dioxide, porous silicon dioxide, porous silicon oxide carbide hydride (SiOCH), silicon nitride, or any combination thereof. In some embodiments, second insulating layer 601 is a dielectric material having k-value less than 3. In some embodiments, second insulating layer 601 is a dielectric material having k-value in an approximate range from about 2.2 to about 2.7. In some embodiments, second insulating layer 601 includes a dielectric material having k-value less than 2. In some embodiments, second insulating layer 601 represents one of the insulating layers described above with respect to insulating layer 102.

In some embodiments, second insulating layer 601 is a low-k interlayer dielectric to isolate one conductive line 201 from adjacent conductive lines 201. In some embodiments, second insulating layer 601 is deposited using one of deposition techniques, such as but not limited to a CVD, spin-on, an ALD, PVD. MBE, MOCVD, or other low-k insulating layer deposition techniques known to one of ordinary skill in the art of microelectronic device manufacturing.

Figure 18A:
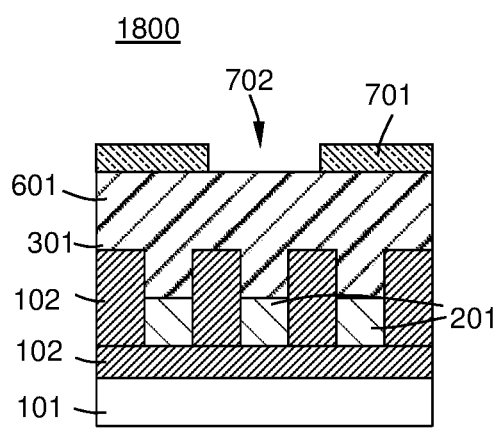
FIG. 18A is a view similar to FIG. 17A after forming a hardmask according to one or more embodiment.
Figure 18B:
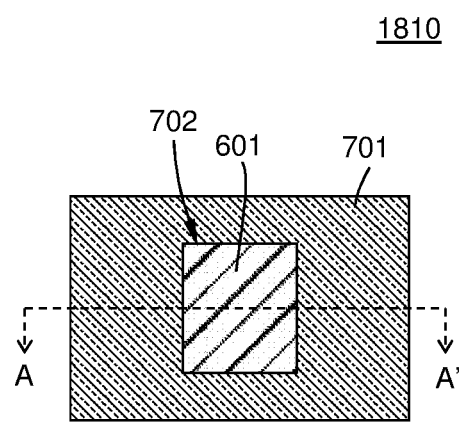
FIG. 18B is a top view of the electronic device structure depicted in FIG. 18A.

FIG. 18A is a view 1800 similar to FIG. 17A, and FIG. 18B is a view 1810 similar to FIG. 17B after a hardmask 701 is formed on second insulating layer 601 according to one embodiment. In some embodiments, hardmask 701 is a metallization layer hardmask. In some embodiments, the hardmask 701 has a first opening 702 that is aligned in the Z axis over one of the first conductive lines 201. In some embodiments, the hardmask 701 is deposited on the second insulating layer 601 and the hardmask 701 is patterned using trench lithography to form one or more first opening 702.

The dimensions and shape of the first openings 702 in the hardmask 701 can vary depending on the configuration of the electronic device structure being formed. In some embodiments, the first openings 702 are wider than the first conductive line 201 aligned with the first opening 702.

The hardmask 701 can be any suitable material including, but not limited to, titanium nitride, tungsten carbide or tungsten borocarbide. In some embodiments, hardmask 701 is a carbon hardmask layer, a metal oxide hardmask layer, a metal nitride hardmask layer, a silicon nitride hardmask layer, a silicon oxide hardmask layer, a carbide hardmask layer, or other hardmask layer known to one of ordinary skill in the art of microelectronic device manufacturing. In some embodiments, the hardmask 701 is formed using one or more hard mask patterning techniques known to one of ordinary skill in the art of microelectronic device manufacturing.

Figure 19A:
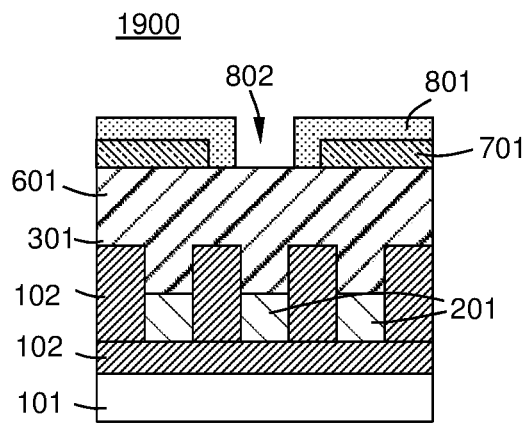
FIG. 19A is a view similar to FIG. 18A, after forming a photoresist according to one or more embodiment.
Figure 19B:
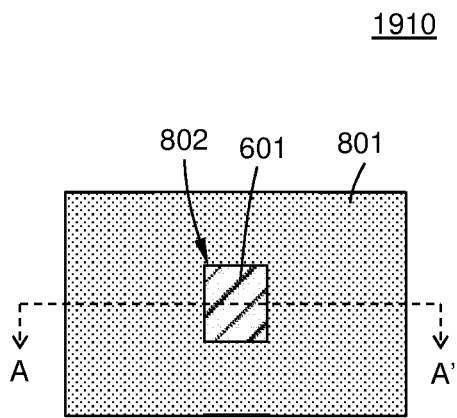
FIG. 19B is a top view of the electronic device structure depicted in FIG. 19A.

FIG. 19A is a view 1900 similar to FIG. 18A, and FIG. 19B is a view 1910 similar to FIG. 18B, after a photoresist 801 is formed on hardmask 701. The photoresist 801 includes a second opening 802 aligned with the first opening 702 so that the second opening 802 is formed above one of the first conductive lines 201.

In some embodiments, forming the photoresist 801 on the hardmask 701 comprises a selective deposition process where the photoresist 801 material is deposited substantially only on the hardmask 701 and not on the second insulating layer 601 exposed through the first opening 702. In some embodiments, the photoresist 801 is formed as a conformal layer of the photoresist material on the hardmask 701 and the second insulating layer 601 is exposed through the first opening 702 and second opening 802 through lithographic patterning. The size of the second opening 802 can be the same as the size of the first opening 702 or different. In the embodiment illustrated in the Figures, the photoresist 801 is selectively deposited on the hardmask 701 so that the sides of the first opening 702 are covered and creating a smaller second opening 802. In some embodiments, the size and dimensions of the second opening 802 are greater than the width of the first conductive line 201 with which the second opening 802 is aligned.

In some embodiments, the photoresist 801 includes a bottom anti-reflective coating (BARC) layer. In some embodiments, photoresist 801 is deposited using one of deposition techniques, such as but not limited to, a CVD, PVD, MBE, PECVD, spin-on, or other insulating layer deposition techniques known to one of ordinary skill in the art of microelectronic device manufacturing. In some embodiments, the second opening 802 is formed using one or more of the patterning and etching techniques known to one of ordinary skill in the art of microelectronic device manufacturing.

Figure 20A:
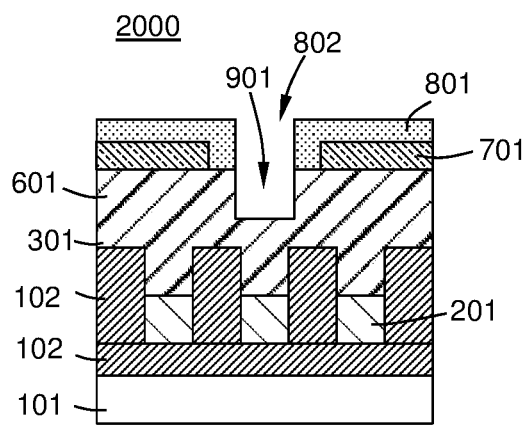
FIG. 20A is a view similar to FIG. 19A after partially etching the second insulating layer according to one or more embodiment.
Figure 20B:
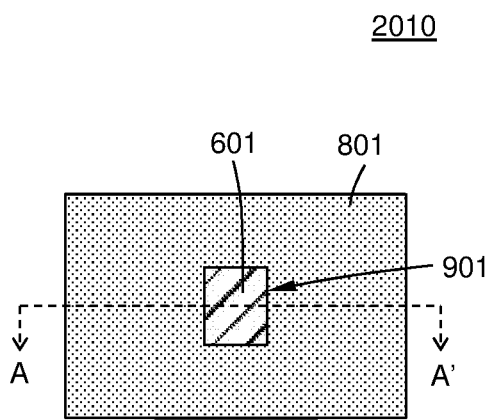
FIG. 20B is a top view of the electronic device structure depicted in FIG. 20A.

FIG. 20A is a view 2000 similar to FIG. 19A, and FIG. 20B is a view 2010 similar to FIG. 19B, after the second insulating layer 601 is partially etched through the second opening 802 to form opening 901. In some embodiments, the second insulating layer 601 is selectively etched through second opening 802 to form an opening 901 according to one embodiment. In some embodiments, the etch process used to remove portions of the second insulating layer 601 is selective to the second insulating layer 601 relative to the first insulating layer 102.

Figure 21A:
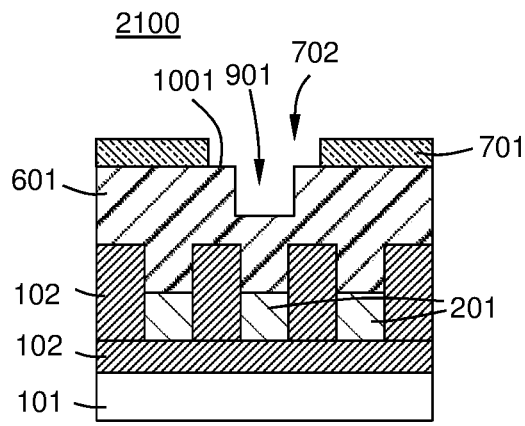
FIG. 21A is a view similar to FIG. 20A after removing the photoresist according to one or more embodiment.
Figure 21B:
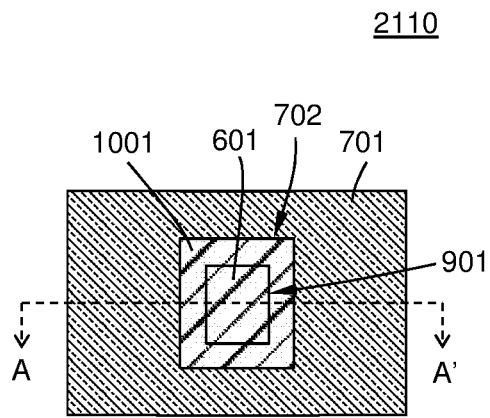
FIG. 21B is a top view of the electronic device structure depicted in FIG. 21A.

FIG. 21A is a view 2100 similar to FIG. 20A, and FIG. 21B is a view 2110 similar to FIG. 20B, after removal of the photoresist 801 to leave hardmask 701 with first opening 702 on the second insulating layer 601. In the embodiment shown, where the second opening 802 was smaller than the first opening 702, removing the photoresist 801 exposes a top surface 1001 of the second insulating layer 601. In embodiments where the first opening 702 and the second opening 802 are the same size, a top surface 1001 of the second insulating layer 601 is not exposed.

In some embodiments, removing the photoresist 801 comprises a process that is selective to the photoresist 801 relative to the hardmask 701 and the second insulating layer 601. In some embodiments, photoresist 801 is removed using one or more of the removal techniques known to one of ordinary skill in the art of microelectronic device manufacturing.

Figure 22A:
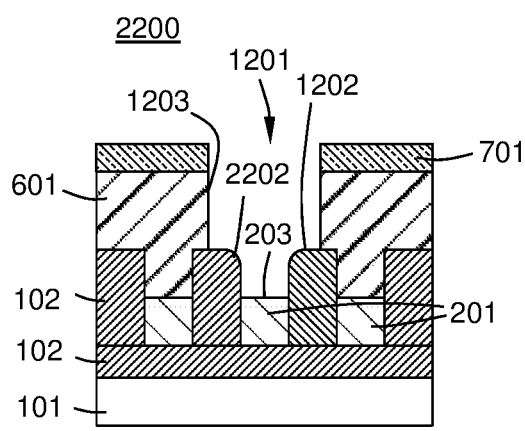
FIG. 22A is a view similar to FIG. 21A after etching the second insulating layer according to one or more embodiment.
Figure 22B:
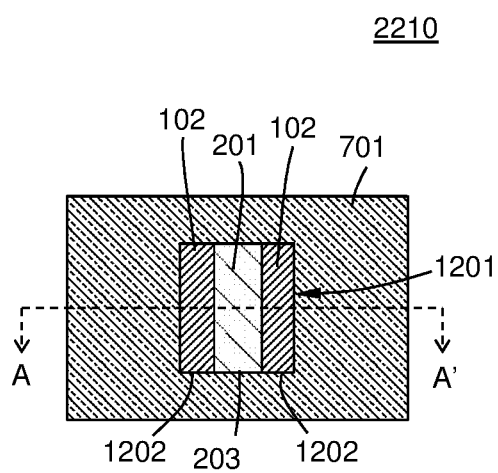
FIG. 22B is a top view of the electronic device structure depicted in FIG. 22A.

FIG. 22A is a view 2200 similar to FIG. 21A, and FIG. 22B is a view 2210 similar to FIG. 21B, after etching the second insulating layer 601 through the first opening 702 to form trench 1101. The etch process of some embodiments is selective to the second insulating layer 601 relative to the first insulating layer 102 and/or the first conductive lines 201, so that the etch process stops at the first conductive lines 201. In the embodiment illustrated, an isotropic etch process through first opening 702 exposes the top surface 203 of the first conductive line 201 aligned with the first opening 702 and the top surface 1202 of the first insulating layer 102 adjacent the first conductive line 201.

In some embodiments, the etch process for the second insulating layer 601 has a selectivity relative to the first insulating layer 102 of greater than or equal to about 5:1. As illustrated in FIG. 22A, rounded corners 2202 of the top surface 1202 of the first insulating layer 102 can be formed during the etch process because some amount of the first insulating layer 102 may be removed. This may open the critical dimension of the via to allow for easier gapfilling with the second conductive lines in a subsequent process.

In some embodiments, etching the second insulating layer 601 is a self-guided process and is confined to a recess trench aligned with one of the first conductive lines 201. In some embodiments, etching the second insulating layer 601 is accomplished using one or more of the removal techniques known to one of ordinary skill in the art of microelectronic device manufacturing.

Figure 23A:
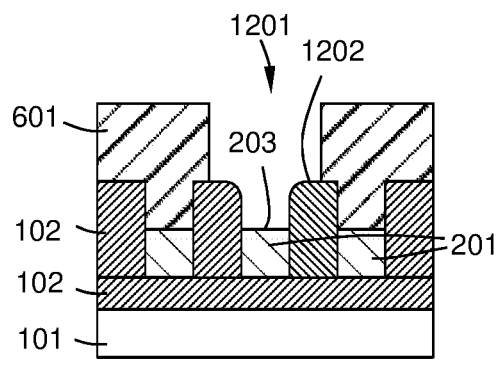
FIG. 23A is a view similar to FIG. 22A after removing the hardmask according to one or more embodiment.
Figure 23B:
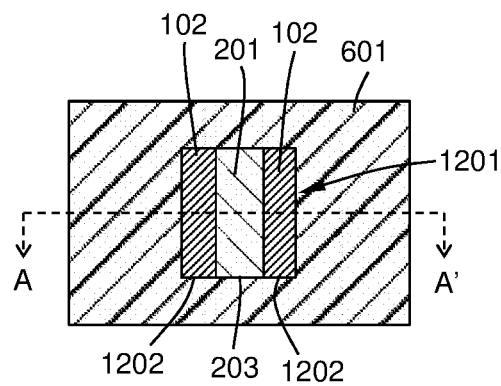
FIG. 23B is a top view of the electronic device structure depicted in FIG. 23A.

FIG. 23A is a view 2300 similar to FIG. 22A, and FIG. 23B is a view 2310 similar to FIG. 22B, after removal of the hardmask 701 from the second insulating layer 601. Removal of the hardmask 701 leaves via 1201 with the top surface 203 of the first conductive line 201 and top surface 1202 of the adjacent first insulating layer 102. Removal of the hardmask 701 can be done using a process that is selective to the hardmask 701 relative to the first conductive line 201, first insulating layer 102 and second insulating layer 601. In some embodiments, hardmask 701 is removed using one or more of the mask layer removal techniques known to one of ordinary skill in the art of microelectronic device manufacturing.

Figure 24A:
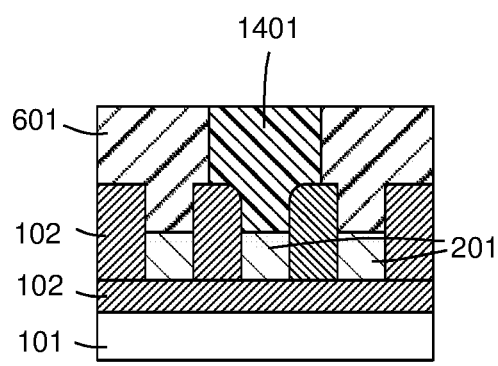
FIG. 24A is a view similar to FIG. 23A after a depositing a second conductive line according to one or more embodiment.
Figure 24B:
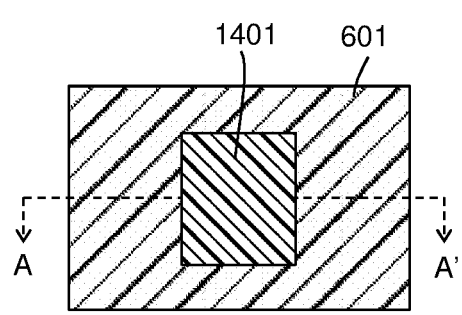
FIG. 24B is a top view of the electronic device structure depicted in FIG. 24A.

FIG. 24A is a view 2400 similar to FIG. 23A, and FIG. 24B is a view 2410 similar to FIG. 23B, after a second conductive line 1401 is deposited into via 1201. In some embodiments, forming the second conductive line 1401 involves filling the via 1201 with a layer of conductive material. In some embodiments, a base layer (not shown) is first deposited on the internal sidewalls and bottom of the via 1201 and then the conductive layer is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g, copper).

In some embodiments, to form the base layer, the conductive barrier layer is deposited onto the sidewalls and bottom of the trenches, and then the seed layer is deposited on the conductive barrier layer. In another embodiment, the conductive base layer includes the seed layer that is directly deposited onto the sidewalls and bottom of the trenches. Each of the conductive barrier layer and seed layer may be deposited using any thin film deposition technique known to one of ordinary skill in the art of semiconductor manufacturing, e.g., sputtering, blanket deposition, and the like. In some embodiments, each of the conductive barrier layer and the seed layer has the thickness in an approximate range from about 1 nm to about 100 nm. In some embodiments, the barrier layer may be a thin dielectric that has been etched to establish conductivity to the metal layer below. In some embodiments, the barrier layer may be omitted altogether and appropriate doping of the copper line may be used to make a "self-forming barrier".

In some embodiments, the conductive layer e.g., copper, is deposited onto the seed layer of base later of copper, by an electroplating process. In some embodiments, the conductive layer is deposited into the trenches using a damascene process known to one of ordinary skill in the art of microelectronic device manufacturing. In some embodiments, the conductive layer is deposited onto the seed layer in the trenches and in the opening using a selective deposition technique, such as but not limited to electroplating, electroless, a CVD, PVD, MBE, MOCVD, ALD, spin-on, or other deposition techniques known to one of ordinary skill in the art of microelectronic device manufacturing.

In some embodiments, the choice of a material for second conductive lines 1401 determines the choice of a material for the seed layer. For example, if the material for the second conductive lines 1401 includes copper, the material for the seed layer may also include copper. In some embodiments, the second conductive line 1401 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof. In some embodiments, examples of the conductive materials that may be used for the conductive lines 1401 include, but not limited to, metal alloys, metal carbides, e.g., hafnium carbide, zirconium carbide, titanium carbide, tantalum carbide, aluminum carbide, other conductive materials, or any combination thereof.

In some embodiments, depositing the second conductive line 1401 comprises depositing a second conductive material in the via 1201 and on the top surface 602 of the second insulating layer 601, forming an overburden. The portions of the conductive material on the top surface 602 (i.e., the overburden) can be removed using a chemical-mechanical polishing ("CMP") technique known to one of ordinary skill in the art of microelectronic device manufacturing.

In some embodiments, the thickness (measured along the Z axis direction) of the second conductive lines 1401 is in an approximate range from about 15 nm to about 1000 nm. In some embodiments, the thickness of the conductive lines 1401 is from about 20 nm to about 200 nm. In some embodiments, the width (measured along the Y axis direction) of the conductive lines 1401 is in an approximate range from about 5 nm to about 500 nm. In some embodiments, the spacing (pitch) between the conductive lines 1401 (measured along the Y axis direction) is from about 2 nm to about 500 nm, or in the range of about 5 nm to about 50 nm.

Figure 25:
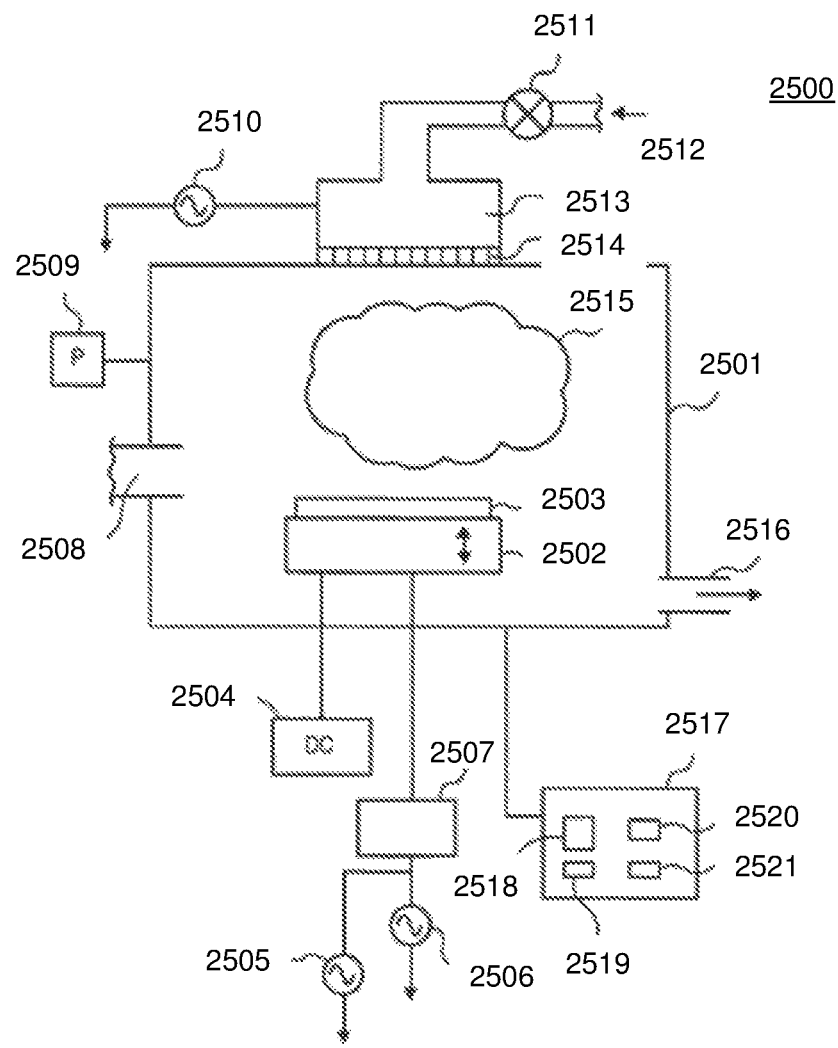
FIG. 25 shows a block diagram of a plasma system to provide a fully self-aligned via according to one or more embodiment.

FIG. 25 shows a block diagram of a plasma system to perform at least some of the operations to provide a fully self-aligned via according to one embodiment. As shown in FIG. 25, system 2500 has a processing chamber 2501. A movable pedestal 2502 to hold an electronic device structure 2503 is placed in processing chamber 2501. Pedestal 2502 comprises an electrostatic chuck ("ESC"), a DC electrode embedded into the ESC, and a cooling/heating base. In an embodiment, pedestal 2502 acts as moving cathode. In an embodiment, the ESC comprises an $Al_2O_3$ material, $Y_2O_3$ or other ceramic materials known to one of ordinary skill of electronic device manufacturing. A DC power supply 2504 is connected to the DC electrode of the pedestal 2502.

As shown in FIG. 25, an electronic device structure 2503 is loaded through an opening 2508 and placed on the pedestal 2502. The electronic device structure 2503 represents one of the electronic device structures described above. System 2500 comprises an inlet to input one or more process gases 2512 through a mass flow controller 2511 to a plasma source 2513. A plasma source 2513 comprising a showerhead 2514 is coupled to the processing chamber 2501 to receive one or more gases 2512 to generate plasma. Plasma source 2513 is coupled to a RF source power 2510. Plasma source 2513 through showerhead 2514 generates a plasma 2515 in processing chamber 2501 from one or more process gases 2512 using a high frequency electric field. Plasma 2515 comprises plasma particles, such as ions, electrons, radicals, or any combination thereof. In an embodiment, power source 2510 supplies power from about 50 W to about 3000 W at a frequency from about 400 kHz to about 162 MHz to generate plasma 2515.

A plasma bias power 2505 is coupled to the pedestal 2502 (e.g., cathode) via a RF match 2507 to energize the plasma. In an embodiment, the plasma bias power 2505 provides a bias power that is not greater than 1000 W at a frequency between about 2 MHz to 60 MHz, and in a particular embodiment at about 13 MHz. A plasma bias power 2506 may also be provided, for example, to provide another bias power that is not greater than 1000 W at a frequency from about 400 kHz to about 60 MHz, and in a particular embodiment, at about 60 MHz. Plasma bias power 2506 and bias power 2505 are connected to RF match 2507 to provide a dual frequency bias power. In an embodiment, a total bias power applied to the pedestal 2502 is from about 10 W to about 3000 W.

As shown in FIG. 25, a pressure control system 2509 provides a pressure to processing chamber 2501. As shown in FIG. 25, chamber 2501 has one or more exhaust outlets 2516 to evacuate volatile products produced during processing in the chamber. In an embodiment, the plasma system 2500 is an inductively coupled plasma (ICP) system. In an embodiment, the plasma system 2500 is a capacitively coupled plasma (CCP) system.

A control system 2517 is coupled to the chamber 2501. The control system 2517 comprises a processor 2518, a temperature controller 2519 coupled to the processor 2518, a memory 2520 coupled to the processor 2518, and input/output devices 2521 coupled to the processor 2518 to form fully self-aligned via as described herein.

In some embodiments, the processor 2518 has a configuration to control recessing first conductive lines on a first insulating layer on a substrate, the first conductive lines extending along a first direction on the first insulating layer. In some embodiments, the processor 2518 has a configuration to control depositing a liner on the recessed first conductive lines. In some embodiments, the processor 2518 has a configuration to control depositing a second insulating layer. In some embodiments, the processor 2518 has a configuration to control removal of an overburden of the second insulating layer. In some embodiments, the process 2518 has a configuration to deposit a predetermined amount of the second insulating layer. In some embodiments, the processor 2518 has a configuration to form a hardmask. In some embodiments, the processor 2518 has a configuration to control forming a first opening in the hardmask. In some embodiments, the processor 2518 has a configuration to control forming a photoresist. In some embodiments, the processor 2518 has a configuration to control forming a second opening in the photoresist. In some embodiments, the processor 2518 has a configuration to control etching the second insulating layer through the second opening. In some embodiments, the processor 2518 has a configuration to control removing the photoresist. In some embodiments, the processor 2518 has a configuration to control etching the second insulating layer to form a fully self-aligned via opening down to one of the first conductive lines or a liner on the first conductive line. In some embodiments, the processor 2518 has a configuration to selectively remove the liner exposed through the via. In some embodiments, the processor 2518 has a configuration to control depositing a conductive layer into the self-aligned via opening, as described above.

The control system 2517 is configured to perform at least some of the methods as described herein and may be either software or hardware or a combination of both. The plasma system 2500 may be any type of high performance processing plasma systems known in the art, such as but not limited to, an etcher, a cleaner, a furnace, or any other plasma system to manufacture electronic devices.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method to provide a self-aligned via, the method comprising:
   recessing first conductive lines on a first insulating layer on a substrate, the first conductive lines extending along a first direction on the first insulating layer;
   depositing a second insulating layer on the first insulating layer and the recessed first conductive lines;
   forming a hardmask on the second insulating layer, the hardmask having a first opening aligned with one of the first conductive lines;
   forming a photoresist on the hardmask, the photoresist having a second opening aligned with the first opening;
   partially etching the second insulating layer to a depth through the second opening;
   removing the photoresist to leave the hardmask with the first opening; and
   etching the second insulating layer through the first opening to form a via.

2. The method of claim 1, further comprising depositing a liner on the recessed first conductive lines and the first insulating layer prior to depositing the second insulating layer.

3. The method of claim 2, wherein the liner is a conformal liner comprising one or more of silicon nitride, silicon carbonitride, aluminum oxide, aluminum nitride or hafnium oxide.

4. The method of claim 2, further comprising removing the liner after etching the second insulating layer through the first opening to expose the first conductive line.

5. The method of claim 4, wherein removing the liner comprises selectively etching the liner relative to the first conductive lines.

6. The method of claim 2, wherein the liner is a conformal film.

7. The method of claim 1, wherein the hardmask comprises one or more of titanium nitride, tungsten carbide or tungsten borocarbide.

8. The method of claim 1, wherein forming the hardmask comprises depositing a hardmask material on the second insulating layer and patterning the hardmask through trench lithography to form the first opening.

9. The method of claim 1, wherein forming the photoresist on the hardmask comprises selectively depositing a photoresist material on the hardmask relative to the second insulating layer to form the second opening.

10. The method of claim 1, wherein forming the photoresist on the hardmask comprises depositing a conformal layer of photoresist material on the hardmask and the second insulating layer exposed in the first opening and lithographically patterning the second opening in the photoresist.

11. The method of claim 1, further comprising depositing a second conductive material into the via.

12. The method of claim 11, wherein depositing the second conductive material comprises depositing the second conductive material in the via and on a top surface of the second insulating layer to form an overburden of the second conductive material and then removing the second conductive material from the top surface of the second insulating layer.

13. A method of forming a self-aligned via, the method comprising:
   providing a substrate comprising a first insulating layer with a plurality of first conductive lines extending in a first direction;
   recessing the first conductive lines so that a top surface of the first conductive lines is a recess depth below a top surface of the first insulating layer;
   depositing a conformal liner on the recessed first conductive lines and the first insulating layer;
   depositing a second insulating layer on the liner on the first insulating layer and the recessed first conductive lines;
   forming a hardmask on the second insulating layer, the hardmask having a first opening aligned with one of the first conductive lines;
   forming a photoresist on the hardmask, the photoresist having a second opening aligned with the first opening;
   partially etching the second insulating layer to a depth through the second opening;
   removing the photoresist to leave the hardmask with the first opening; and
   etching the second insulating layer through the first opening to expose the liner in the recessed first conductive line; and
   removing the liner in the first conductive line to form a via.

14. The method of claim 13, wherein the conformal liner comprises one or more of silicon nitride, silicon carbonitride, aluminum oxide, aluminum nitride or hafnium oxide.

15. The method of claim 13, wherein the hardmask comprises one or more of titanium nitride, tungsten carbide or tungsten borocarbide.

16. The method of claim 13, wherein forming the hardmask comprises depositing a hardmask material on the second insulating layer and patterning the hardmask through trench lithography to form the first opening.

17. The method of claim 13, wherein forming the photoresist on the hardmask comprises depositing a conformal layer of photoresist material on the hardmask and the second insulating layer exposed through the first opening and lithographically patterning the second opening in the photoresist.

18. The method of claim 13, further comprising depositing a second conductive material into the via.

19. The method of claim 18, wherein depositing the second conductive material comprises depositing the second conductive material in the via and on a top surface of the second insulating layer to form an overburden of the second conductive material and then removing the second conductive material from the top surface of the second insulating layer.

20. A method of forming a self-aligned via, the method comprising:

providing a substrate comprising a first insulating layer with a plurality of first conductive lines extending in a first direction;

recessing the first conductive lines so that a top surface of the first conductive lines is a recess depth below a top surface of the first insulating layer;

depositing a second insulating layer directly on the first insulating layer and the recessed first conductive lines;

forming a hardmask on the second insulating layer, the hardmask having a first opening aligned with one of the first conductive lines;

forming a photoresist on the hardmask, the photoresist having a second opening aligned with the first opening;

partially etching the second insulating layer to a depth through the second opening;

removing the photoresist to leave the hardmask with the first opening; and etching the second insulating layer through the first opening to expose the first conductive line to form a via.

* * * * *

UNITED STATES PATENT AND TRADEMARK OFFICE
CERTIFICATE OF CORRECTION

PATENT NO. : 10,593,594 B2
APPLICATION NO. : 16/216247
DATED : March 17, 2020
INVENTOR(S) : Yung-Chen Lin et al.

Page 1 of 1

It is certified that error appears in the above-identified patent and that said Letters Patent is hereby corrected as shown below:

In the Specification

In Column 7, Line 29, replace "fluourosilicate" with "fluorosilicate".

In Column 10, Line 27, replace "AlO" with "$Al_2O_3$".

Signed and Sealed this
Second Day of June, 2020

Andrei Iancu
*Director of the United States Patent and Trademark Office*